United States Patent [19]

Stevenson

[11] Patent Number: 4,650,285

[45] Date of Patent: Mar. 17, 1987

[54] HOT ALIGNMENT ASSEMBLY METHOD FOR OPTOELECTRONIC PACKAGES

[75] Inventor: David W. Stevenson, Mesa, Ariz.

[73] Assignee: Motorola, Inc., Schaumburg, Ill.

[21] Appl. No.: 602,307

[22] Filed: Apr. 20, 1984

[51] Int. Cl.⁴ .............................................. G02B 6/36
[52] U.S. Cl. .................................. 350/320; 350/96.20; 357/80
[58] Field of Search ............... 350/96.15, 96.17, 96.18, 350/96.20, 320; 250/227, 552; 357/74, 80, 81, 84

[56] References Cited

U.S. PATENT DOCUMENTS

| | | | |
|---|---|---|---|
| 4,186,995 | 2/1980 | Schumacher | 350/96.20 |
| 4,295,152 | 10/1981 | Khoe et al. | 357/74 |
| 4,394,061 | 7/1983 | Schroeder | 350/96.20 |
| 4,399,453 | 8/1983 | Berg et al. | 357/81 |
| 4,456,334 | 6/1984 | Henry et al. | 350/320 |

OTHER PUBLICATIONS

Abe et al, "High-Efficiency Long-Lived GaAlAs LED's for ...," *IEEE Trans. on Electron Devices*, vol. ED-24, No. 7, Jul. 1977, pp. 990–994.
Johnson et al, "Connectorized Optical Link Package Incorporating ...," *IEEE Trans. on Components, Hybrids, & Manuf. Tech.*, vol. CHMT-3, No. 4, Dec. 1980, pp. 488–492.
Stevenson, "An Approach to Low Cost Fiber Optics Components," *Electro*/82, Session 27, paper 2, May 1982, 6 pp.

Primary Examiner—John Lee
Attorney, Agent, or Firm—Joe E. Barbee

[57] ABSTRACT

A method is provided for low cost assembly of semiconductive optoelectronic devices by hot aligning wide tolerance components. In the hot alignment step, electrical power is applied to the semiconductor to aid in an optical alignment operation.

6 Claims, 2 Drawing Figures

HOT ALIGNMENT ASSEMBLY METHOD FOR OPTOELECTRONIC PACKAGES

BACKGROUND

This invention relates to the assembly or packaging of semiconductive optoelectronic devices and, in particular, to an improved method for accurately assembling devices for use in optical fiber communication systems.

As known in the art, communication by way of optical fiber has many advantages over communication by way of other media. An obstacle to the increased use of optical fiber media is the cost of the components or, more directly, the distance over which one can communicate directly, i.e. without a repeater or other intervening means. In part, this distance is determined by the characteristics of the optical fiber. In part, the distance is determined by the power (flux density) of the light emitted and the sensitivity of the detector.

There are two ways, basically, to increase the flux density in the fiber. One is to use a higher power emitter. The other is to increase the efficiency of the coupling of light from the emitter to the fiber. On the receiving end, one has the corresponding choices of increasing the performance, and cost, of the light detector or increasing the efficiency of the optical coupling from the fiber to the detector.

In the prior art, the use of glass beads as lenses increased the coupling efficiency into and out of the semiconductor die. In Ser. No. 272,822, filed June 12, 1981 (now abandoned) and assigned to the assignee of the present invention, efficiency and light control are described as further improved by controlling the spacing between the semiconductor and the lens.

A complete semiconductor device includes a die, which may comprise an emitter, a detector, or both; a header for mechanical support, electrical connections, and heat spreading; and a cap having a window through which the light passes. There is also usually a thermally conductive, electrically insulating substrate between the semiconductor die and the header.

Despite the advances in coupling efficiency described above, much light is lost between the lens and the fiber due to misalignment within the package. This is due to the cumulative error in assembling the various parts. While the lens may be accurately placed radially with respect to the photoactive area on the semiconductor die, there is a tolerance in locating the die on the substrate, the die and substrate on the header, and the cap on the header. Since the optical fiber in a connector is located with respect to the outside surface of the cap, the cumulative error can be devastating. More specifically, yields go down and costs go up.

At present, two approaches have been used to solve the problem. The first is to specify tight tolerances for all parts and assembly operations. This technique produces devices with acceptable characteristics but at high cost. The alternative is to design devices to accommodate radial misalignment.

The art at present typically uses fiber having a core diameter of 200 micron (8 mil). The package is designed with a projected spot size of 300 micron (12 mil), i.e. the size of the image of the emitter as seen at the window at the top of the cap. Despite using precision parts, one can obtain a worst-case cumulative error of 75 micron (3 mil). This can be tolerated with 200 micron fiber and a 300 micron projected spot size. The problem is the significant, over fifty percent, reduction in light flux launched into the fiber even under optimum conditions. Worse, for the manufacturer, the art appears to be standardizing on 85 micron fiber core. With a worst-case cumulative error of 75 micron, the light loss will be much higher with this fiber.

In view of the foregoing, it is therefore an object of the present invention to provide an improved assembly method for optoelectronic devices.

Another object of the present invention is to eliminate cumulative error in assembling optoelectronic devices.

A further object of the present invention is to provide low cost, high performance optoelectronic devices using standard piece parts.

Another object of the present invention is to provide improved optoelectronic devices in which the diameter of the projected spot size is less than the sum of the diameter of the optical fiber plus the tolerance of the header to the cap.

A further object of the present invention is to eliminate the need for highly accurate die bonding.

Another object of the present invention is to optimize coupling efficiency by enabling the diameter of the projected spot to be equal to the diameter of the core of the adjacent fiber.

SUMMARY

The foregoing objects are achieved in the present invention wherein low cost components are used for the header and cap. The parts previously noted are mounted on the header to within some empirically determined cumulative error. The header fits loosely within the cap, within a tolerance equal to or greater than said cumulative error. During the assembly of said header and cap, the optoelectronic device is powered to emit or detect light. The cap and header are moved relative to each other until maximum light flux is detected, at which point they are permanently joined.

A more complete understanding of the present invention can be obtained by considering the following detailed description in conjunction with the accompanying drawings, in which.

Figure 1:
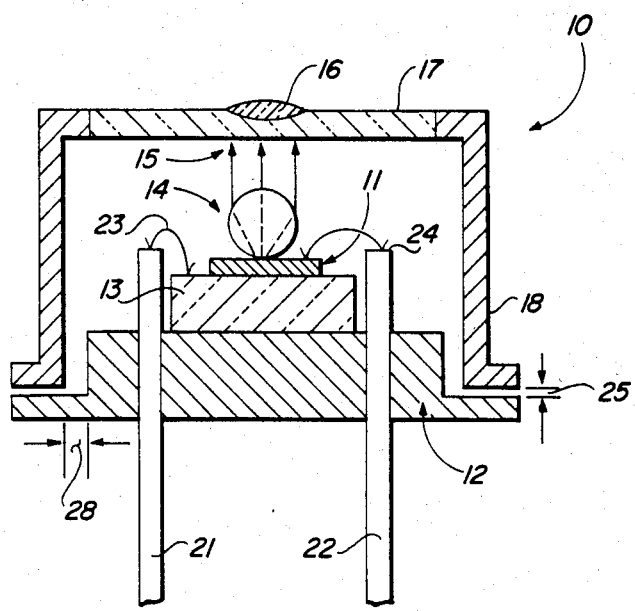
FIG. 1 illustrates an optoelectronic device in accordance with the present invention.

Optoelectronic device 10 comprises a semiconductor die 11 attached to header 12 by way of electrical insulator 13. Die 11 can comprise any suitable material for the emission or detection of photons, such as, but not limited to, silicon or gallium arsenide devices. Insulator 13 is a thermally conductive, electrically insulating material such as beryllium oxide. Die 11 and insulator 13 are fastened together and are fastened to header 12 by any suitable means, such as soldering or conductive epoxy. Overlying die 11 and approximately centered over the photoactive area thereof is lens 14, which typically comprises a glass bead. Lens 14 is held in place by any suitable means, not shown, as well-known to those of skill in the art.

Assuming that die 11 is a photoemitter, the light therefrom is gathered by lens 14 and redirected as beam 15 toward a predetermined location 16 within window 17 of cap 18. The actual size of spot 16 depends upon several factors, as known in the art, including the spacing between lens 14 and die 11 as well as the refractive indices of the various materials and the sizes of the photoactive area itself and lens 14. The diameter of projected spot 16 can thus be tailored to the particular application. The problem with prior art devices is the side-to-side, or radial, alignment of spot 16 relative to the outside diameter of cap 18.

Figure 2:
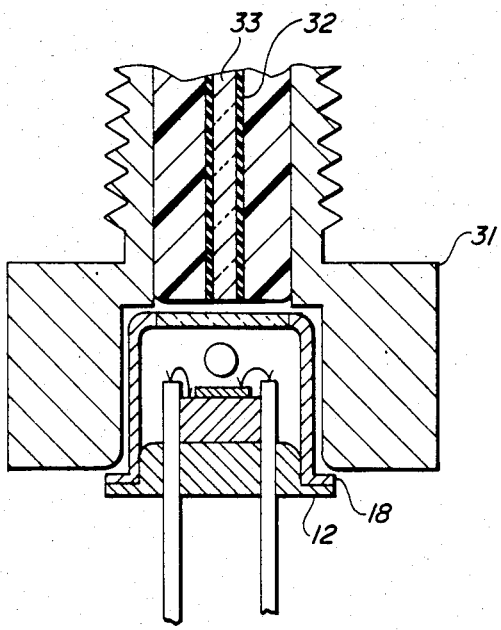
FIG. 2 illustrates the use of a device manufactured in accordance with the present invention.

As illustrated in FIG. 2, a completed optoelectronic device is inserted into a fitting 31 comprising optical fiber 32 having light transmissive core 33. Core 33 is centrally located relative to the chamber formed in connector 31 for cap 18. That is, cap 18 is located by its outside diameter and the projected spot is expected to fall directly beneath core 33. When the projected spot is not aligned with the end of core 33, substantial light losses can occur.

Returning to FIG. 1, in the prior art one attempted to accurately bond die 11 to substrate 13 and, in turn, bond substrate 13 quite accurately with respect to header 12. Header 12 comprises a central pedestal surrounded by a step portion for engaging a corresponding flange on cap 18. The inside diameter of cap 18 and the outside diameter of the pedestal on header 12 were made very nearly the same to accurately locate cap 18 with respect to header 12, and hence substrate 13, and hence die 11.

In accordance with the present invention, this careful alignment is no longer necessary. Header 12 is prepared as before, except that substantially wider tolerances are permitted in the assembly of die 11, substrate 13, and header 12. Header 12 comprises conductors 21 and 22 which pass therethrough and have the inner ends thereof wire bonded to die 11 by way of wire bonds 23 and 24, respectively. Conductors 21 and 22 are typically electrically insulated from header 12 by any suitable means, not shown. In accordance with the present invention, cap 18 is held in a chuck not unlike connector 31 as illustrated in FIG. 2. The chuck includes a centrally mounted optical fiber for communicating with the die. An appropriate voltage is applied across conductors 21 and 22 to activate the die. In the case of a light emitting die, the light is collected and redirected by lens 14 toward a predetermined projection spot 16. Header 12 is mounted in a suitable chuck, known per se in the art, which provides both electrical connection and precise motion of header 12 relative to cap 18. Header 12 is brought to within a predetermined distance of cap 18, represented in FIG. 1 by gap 25. Header 12 is then radially moved relative to cap 18 until a maximum output is detected in the optical fiber within the chuck holding cap 18. At that point, cap 18 and header 12 are brought together and a voltage applied thereacross to weld the two together about the periphery thereof. As known per se in the art, this weld provides a hermetic seal for die 11 within the chamber formed between cap 18 and header 12. After the welding is completed, the finished device is removed and the chuck is reloaded with additional parts.

In contrast with prior art attempts to attain precision, in accordance with the present invention the outside diameter of the pedestal on header 12 is distinctly smaller than the inside diameter of cap 18. The gap or clearance therebetween, illustrated in FIG. 1 as gap 28, enables one to move cap 18 a considerable distance relative to header 12. In all cases, the distance exceeds the distance necessary to accommodate the cumulative error in the positioning of die 11 and substrate 13. It should be noted that as illustrated in FIG. 1, gap 28 is not the maximum attainable since header 12 is illustrated as approximately centered beneath cap 18. In this case, the actual maximum clearance is approximately twice the dimension designated by reference numeral 28. Surprisingly, one cannot use precise parts as with the prior art in carrying out the present invention. Such parts simply do not allow enough adjustment to make up for the cumulative error obtained in mounting die 11 and substrate 13.

There is thus provided by the present invention an extremely low cost method for assembling packaged optoelectronic devices. Despite the low cost, the alignment of the cap with the photoactive area of the die is more accurate than the alignment obtainable using precision piece parts. Header 12 is readily maneuvered relative to cap 18 by the use of an X-Y micromanipulator, well-known per se in the art. Further, it is a process quite amenable to automation since one merely has to sense maximum light coupling and then proceed with the welding. Further, the accuracy desired is determined, in part, by the diameter of the fiber within the chuck holding cap 18, i.e. the smaller the fiber the more accurate the placement of the header.

Having thus described the invention, it will be apparent to those of skill in the art that various modifications can be made in accordance with the spirit and scope of the present invention. For example, while primarily described in terms of a light emitting device, it is understood by those of skill in the art that the benefits of the present invention are obtained by detectors as well. Further, it is desirable but not necessary to use substrate 13 between die 11 and header 12. Further, while described in conjunction with what is known as a TO-46 header, the present invention should not be construed as so limited but as amenable to other package configurations as well. While described as a window, the light transmissive portion of cap 18 can comprise a refractive element for further re-directing the light entering or leaving the package.

I claim:

1. A method for assembling an optoelectronic device, said device having a photoactive semiconductor die attached to a header, comprising the steps of:
    providing a loosely fitting cap means for said header;
    electrically activating said semiconductor die;
    holding said cap means with a chuck;
    aligning said cap means with said die according to the amount of light coupled through said cap means; and
    permanently attaching said cap means to said header by welding said cap means to said header by applying a voltage across the chuck and a fixture holding the header.

2. The method as set forth in claim 1 wherein said aligning step comprises positioning said cap means so that a maximum amount of light passes through a predetermined location in said cap means.

3. The method as set forth in claim 1 wherein said attaching step comprises hermetically sealing said cap means to said header.

4. The method as set forth in claim 1 wherein said providing step comprises selecting a cap means and header so that said cap means can be moved radially with respect to said header by an amount greater than the cumulative error in attaching said die to said header.

5. A method for assembling an optoelectronic device having a photoactive semiconductor die attached to a header, the method comprising the steps of: inserting at least a portion of a loosely fitting cap into chuck means, the chuck means having a centrally mounted optical fiber in alignment with a window in the cap; bringing the chuck means into close proximity to the header; electrically activating the semiconductor die; aligning the header and the cap to maximize the amount of light that is coupled between the optical fiber and the semiconductor die; applying a voltage across the chuck means and a fixture holding the header to weld the loosely fitting cap and the header together thereby establishing permanent alignment between the photoactive semiconductor die and the window in the cap.

6. The method of claim 5 wherein the semiconductor die is hermetically sealed within the header and the cap when the welding is performed.

* * * * *